(12) United States Patent
Lee et al.

(10) Patent No.: US 8,966,326 B2
(45) Date of Patent: Feb. 24, 2015

(54) ERROR DETECTING CIRCUIT AND SEMICONDUCTOR APPARATUS INCLUDING THE SAME

(71) Applicant: SK hynix Inc., Icheon-si Gyeonggi-do (KR)

(72) Inventors: Kang Youl Lee, Icheon-si (KR); Mun Phil Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 106 days.

(21) Appl. No.: 13/772,187

(22) Filed: Feb. 20, 2013

(65) Prior Publication Data

US 2013/0166993 A1 Jun. 27, 2013

Related U.S. Application Data

(63) Continuation-in-part of application No. 12/841,070, filed on Jul. 21, 2010, now abandoned.

(30) Foreign Application Priority Data

Apr. 30, 2010 (KR) ........................ 10-2010-0040664

(51) Int. Cl.
*G06F 11/00* (2006.01)
*G11C 29/42* (2006.01)
*G11C 29/04* (2006.01)

(52) U.S. Cl.
CPC .............. *G06F 11/006* (2013.01); *G11C 29/42* (2013.01); *G11C 2029/0409* (2013.01); *G11C 2029/0411* (2013.01)
USPC ........................................................ 714/47.2

(58) Field of Classification Search
CPC .............. G06F 11/006; G06F 11/1048; G06F 11/2215; G06F 11/0751; G06F 11/0763; G11C 2029/0411; G11C 2029/0409; G11C 29/42; G11C 2207/104; G11C 11/4096
See application file for complete search history.

(56) References Cited

U.S. PATENT DOCUMENTS

| 7,882,417 | B2* | 2/2011 | Chung et al. | 714/755 |
| 8,756,475 | B2* | 6/2014 | Chung et al. | 714/755 |
| 2011/0107191 | A1* | 5/2011 | Chung et al. | 714/807 |
| 2014/0077775 | A1* | 3/2014 | Gotou | 323/234 |

* cited by examiner

*Primary Examiner* — Nadeem Iqbal
(74) *Attorney, Agent, or Firm* — William Park & Associates Patent Ltd.

(57) ABSTRACT

An error detecting circuit of a semiconductor apparatus, comprising: a fail detecting section configured to receive 2-bit first test data signals outputted from a first block and 2-bit second test data signals outputted from a second block, disable a first fail detection signal when the 2-bit first test data signals have different levels, disable a second fail detection signal when the 2-bit second test data signals have different levels, and disable both the first and second fail detection signals when the 2-bit first test data signals have the same level, the 2-bit second test data signals have the same level, and levels of the 2-bit first test data signals and the 2-bit second test data signals are the same with each other.

8 Claims, 8 Drawing Sheets

FIG.3

|  | First Block | | Second Block | | DET_C1B | Result | Expect | Remarks |
| --- | --- | --- | --- | --- | --- | --- | --- | --- |
|  | D1_2 | D1_6 | D2_2 | D2_6 | | | | |
| 1 | 0 | 0 | 0 | 0 | 1 | Pass | Pass | |
| 2 | 0 | 0 | 0 | 1 | 0 | Fail | Fail | |
| 3 | 0 | 0 | 1 | 0 | 0 | Fail | Fail | |
| 4 | 0 | 0 | 1 | 1 | 0 | Fail | Fail | |
| 5 | 0 | 1 | 0 | 0 | 0 | Fail | Fail | |
| 6 | 0 | 1 | 0 | 1 | 0 | Fail | Fail | |
| 7 | 0 | 1 | 1 | 0 | 0 | Fail | Fail | |
| 8 | 0 | 1 | 1 | 1 | 0 | Fail | Fail | |
| 9 | 1 | 0 | 0 | 0 | 0 | Fail | Fail | |
| 10 | 1 | 0 | 0 | 1 | 0 | Fail | Fail | |
| 11 | 1 | 0 | 1 | 0 | 0 | Fail | Fail | |
| 12 | 1 | 0 | 1 | 1 | 0 | Fail | Fail | |
| 13 | 1 | 1 | 0 | 0 | 0 | Fail | Fail | |
| 14 | 1 | 1 | 0 | 1 | 0 | Fail | Fail | |
| 15 | 1 | 1 | 1 | 0 | 0 | Fail | Fail | |
| 16 | 1 | 1 | 1 | 1 | 1 | Pass | Fail | Determination Error |

FIG.5

|    | First Block |      | Second Block |      | DET1_1B | Result | Expect | Remarks |
|----|------|------|------|------|---------|--------|--------|---------|
|    | D1_2 | D1_6 | D2_2 | D2_6 |         |        |        |         |
| 1  | 0 | 0 | 0 | 0 | 1 | Pass | Pass |   |
| 2  | 0 | 0 | 0 | 1 | 1 | Pass | Pass |   |
| 3  | 0 | 0 | 1 | 0 | 1 | Pass | Pass |   |
| 4  | 0 | 0 | 1 | 1 | 1 | Pass | Pass |   |
| 5  | 0 | 1 | 0 | 0 | 0 | Fail | Fail |   |
| 6  | 0 | 1 | 0 | 1 | 0 | Fail | Fail |   |
| 7  | 0 | 1 | 1 | 0 | 0 | Fail | Fail |   |
| 8  | 0 | 1 | 1 | 1 | 0 | Fail | Fail |   |
| 9  | 1 | 0 | 0 | 0 | 0 | Fail | Fail |   |
| 10 | 1 | 0 | 0 | 1 | 0 | Fail | Fail |   |
| 11 | 1 | 0 | 1 | 0 | 0 | Fail | Fail |   |
| 12 | 1 | 0 | 1 | 1 | 0 | Fail | Fail |   |
| 13 | 1 | 1 | 0 | 0 | 1 | Pass | Fail | Determination Error |
| 14 | 1 | 1 | 0 | 1 | 1 | Pass | Fail | Determination Error |
| 15 | 1 | 1 | 1 | 0 | 1 | Pass | Fail | Determination Error |
| 16 | 1 | 1 | 1 | 1 | 1 | Pass | Fail | Determination Error |

… (US 8,966,326 B2)

ERROR DETECTING CIRCUIT AND SEMICONDUCTOR APPARATUS INCLUDING THE SAME

CROSS-REFERENCES TO RELATED APPLICATION

The application is a continuation-in-part of application Ser. No. 12/841,070, filed Jul. 21, 2010, titled "Test Circuit and Semiconductor memory apparatus including the same", which is incorporated herein by reference in its entirety as if set forth in full.

BACKGROUND

1. Technical Field

The present invention relates to a semiconductor apparatus, and more particularly, to a method for detecting and repairing a fail of an error detecting circuit and semiconductor apparatus including the same.

2. Related Art

A compressed test is used to reduce a test time. The compressed test is performed by writing the same data to a plurality of circuits and compressing and outputting the written data of the plurality of circuits. Since the semiconductor apparatus is divided into a plurality of circuits, a rate of fail detection and an efficiency of repair are determined by arrangement of circuits to be tested and the combination of data in the compressed test.

SUMMARY

In an embodiment of the present invention, an error detecting circuit includes: a first fail detection unit configured to detect a fail of a first block by combining a plurality of first test data signals outputted from the first block; a second fail detection unit configured to detect a fail of a second block by combining a plurality of second test data signals outputted from the second block; a common fail detection unit configured to detect a fail of the first and second blocks by combining the plurality of first test data signals and the plurality of second test data signals; and a fail determination unit configured to output detection results of the first and second fail detection units or a detection result of the common fail detection unit according to the detection results of the first and second fail detection units.

In an embodiment of the present invention, an error detecting circuit includes: a first fail detection unit configured to detect a fail of a first block by combining a plurality of first test data signals outputted from the first block; a second fail detection unit configured to detect a fail of a second block by combining a plurality of second test data signals outputted from the second block; a common fail detection unit configured to detect the fail of the first and second blocks by combining the plurality of first test data signals and the plurality of second test data signals; and a selection unit configured to output detection results of the first and second fail detection units or a detection result of the common fail detection unit according to a mode selection signal.

In another embodiment of the present invention, a semiconductor apparatus includes: a first fail detection unit configured to detect a fail of a first block by combine a plurality of first test data signals outputted from the first block; a second fail detection unit configured to detect a fail of a second block by combining a plurality of second test data signals outputted from the second block; a common fail detection unit configured to detect a fail of the first and second blocks by combining the plurality of first test data signals and the plurality of second test data signals; a fail determination unit configured to output detection results of the first and second fail detection units or a detection result of the common fail detection unit; a redundancy block including a plurality of redundancy blocks; and a repair unit configured to replace the first and second blocks with the redundancy blocks based on the detection result outputted from the fail determination unit.

In an embodiment of the present invention, an error detecting circuit of a semiconductor apparatus, comprising: a fail detecting section configured to receive 2-bit first test data signals outputted from a first block and 2-bit second test data signals outputted from a second block, disable a first fail detection signal when the 2-bit first test data signals have different levels, disable a second fail detection signal when the 2-bit second test data signals have different levels, and disable both the first and second fail detection signals when the 2-bit first test data signals have the same level, the 2-bit second test data signals have the same level, and levels of the 2-bit first test data signals and the 2-bit second test data signals are the same with each other.

In an embodiment of the present invention, an error detecting circuit of a semiconductor apparatus, comprising: a first fail detecting section configured to receive some test data signals among a plurality of first test data signals outputted from a first block, receive some test data signals among a plurality of second test data signals outputted from a second block, and generate a first fail detection signal and a second fail detection signal; a second fail detecting section configured to receive remaining test data signals among the plurality of first test data signals, receive remaining test data signals among the plurality of second test data signals, and generate a third fail detection signal and a fourth fail detection signal; and a fail determining section configured to enable a first final fail detection signal when both the first and third fail detection signals are enabled, and enable a second final fail detection signal when both the second and fourth fail detection signals are enabled.

BRIEF DESCRIPTION OF THE DRAWINGS

Features, aspects, and embodiments are described in conjunction with the attached drawings, in which:

FIG. 3 is a truth table illustrating an operation of the error detecting unit in FIG. 2;

FIG. 5 is a truth table illustrating an operation of the error detecting unit in FIG. 4;

DETAILED DESCRIPTION

Figure 1:
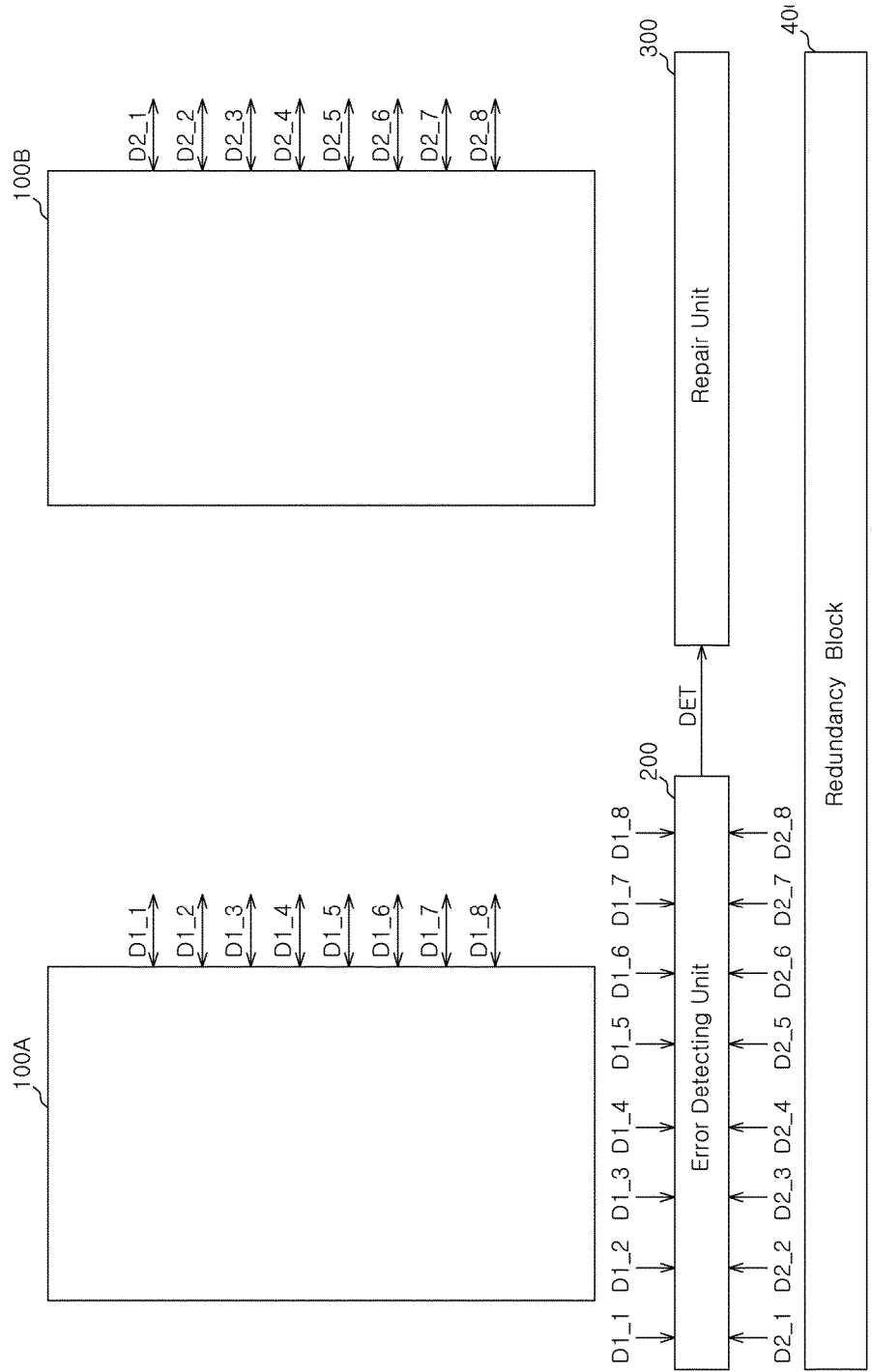
FIG. 1 is a diagram schematically illustrating a configuration of a semiconductor apparatus in accordance with an embodiment of the present invention.

Reference will now be made in detail to the exemplary embodiments consistent with the present disclosure, examples of which are illustrated in the accompanying drawings. Whenever possible, the same reference numerals will be used throughout the drawings to refer to the same or like parts.

For reference, since terms, symbols and signs in drawings and in this detailed description to designate devices, blocks, and so on may be used for detailed units as the occasion demands, it is to be noted that the same terms, symbols and signs may not designate the same devices, blocks, and so on in an entire circuitry. Also, the logic signals of a circuit and binary data values are divided into a high level (H) or a low level (L) in correspondence to voltage levels, and may be represented as '1' and '0'. Furthermore, as the occasion demands, a high impedance state (a high-Z state) may be defined and described.

FIG. 1 is a diagram schematically illustrating a configuration of a semiconductor apparatus in accordance with an embodiment of the present invention.

The semiconductor apparatus in accordance with an embodiment of the present invention may include a simple configuration for clear explanation of the technical principles of the present invention.

Referring to FIG. 1, the semiconductor apparatus may include a plurality of blocks 100A and 100B, an error detecting unit 200, a repair unit 300, and a redundancy block 400.

The detailed configuration and principal operation of the semiconductor apparatus configured as described above will be described below.

The plurality of blocks 100A and 100B include a first block 100A and a second block 100B.

The first block 100A and the second block 100B may be internal circuits of the semiconductor apparatus. For example, the internal circuits may be receivers or transmitters or buffers or memory circuits, etc.

In a compressed test, the same test data is stored in a selected block, and a plurality of test data signals outputted from the block are compressed and outputted. A repair circuit replaces the corresponding block with a redundancy block according to a compressed fail detection result.

The error detecting unit 200 detects the fail of the corresponding block based on a plurality of first test data signals D1_1-D1_8 outputted from the first block 100A and a plurality of second test data signals D2_1-D2_8 outputted from the second block 100B.

Furthermore, the repair unit 300 replaces the block, which is determined to be a failed block based on the detection result of the error detecting unit 200, with the redundancy block 400. The redundancy block 400 includes a plurality of redundancy groups. Although the redundancy block 400 and the blocks 100A and 100B are separately provided in FIG. 1, a plurality of redundancy groups may be disposed within the blocks 100A and 100B.

Figure 2:
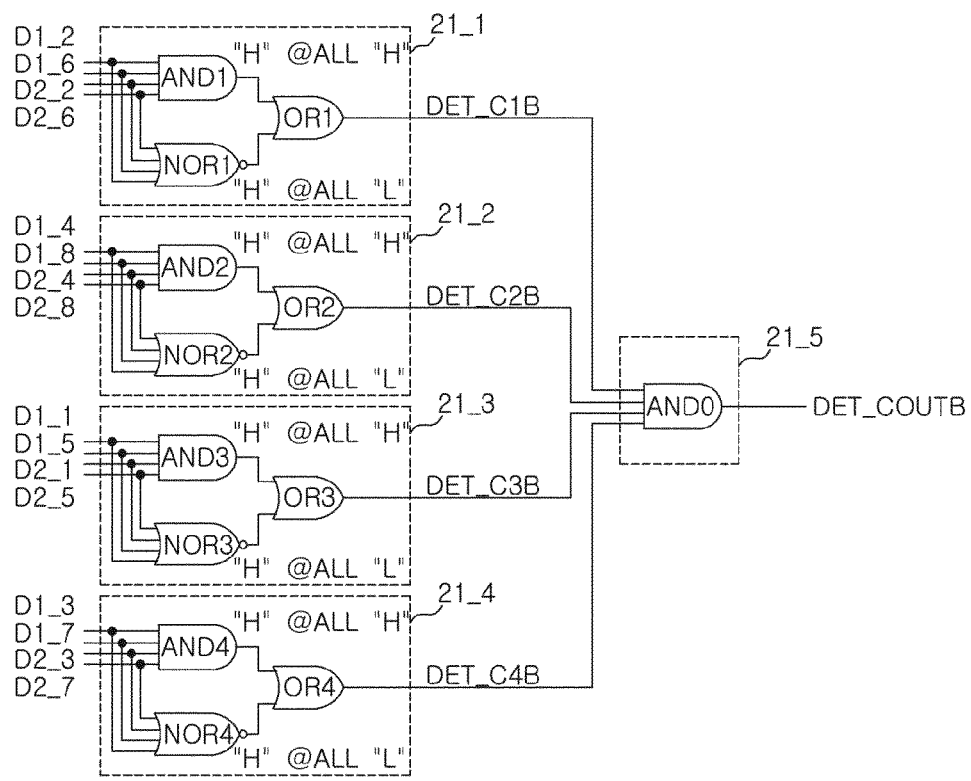
FIG. 2 is a diagram illustrating a configuration of an error detecting unit in FIG. 1 in accordance with a first embodiment of the present invention.

FIG. 2 is a diagram illustrating a configuration of an error detecting unit in FIG. 1 in accordance with a first embodiment of the present invention.

Referring to FIG. 2, the error detecting unit simultaneously detects the fail of the blocks 100A and 100B by combining the plurality of first test data signals D1_1-D1_8 outputted from the first block 100A and the plurality of second test data signals D2_1-D2_8 outputted from the second block 100B.

When any one block of the first block 100A and the second block 100B is failed, the error detecting unit outputs a detection result that all the first and second blocks 100A and 100B have failed.

The error detecting unit may include a plurality of sub common fail detection sections 21_1-21_4 and a signal combination section 21_5. The plurality of common fail detection sections 21_1-21_4 combine the plurality of first test data signals D1_1-D1_8 and the plurality of second test data signals D2_1-D2_8 as many as the allocated number, and output a plurality of sub common fail detection signals DET_C1B-DET_C4B. Since the plurality of sub common fail detection sections 21_1-21_4 have the same configuration and perform the same operation, the first sub common fail detection section 21_1 will be representatively described.

The first sub common fail detection section 21_1 may include an exclusive NOR (XNOR) logic. The XNOR logic may consist of an ANDing element AND1, a NORing element NOR1, and an ORing element OR1.

The first sub common fail detection section 21_1 outputs the first sub common fail detection signal DET_C1B by performing an XNOR operation on the two test data signals D1_2 and D1_6, which are allocated thereto among the plurality of first test data signals D1_1-D1_8 outputted from the first block 100A, and the two test data signals D2_2 and D2_6, which are allocated thereto among the plurality of second test data signals D2_1-D2_8 outputted from the second block 100B. Therefore, when the four test data signals D1_2, D1_6, D2_2 and D2_6 have the same data value, the first sub common fail detection signal DET_C1B is deactivated to a high level. This means that no fail is detected. When any one of the four test data signals D1_2, D1_6, D2_2 and D2_6 has a different data value, the first sub common fail detection signal DET_C1B is activated to a low level. This means that the fail is detected. Since the fail is detected by combining the four test data signals D1_2, D1_6, D2_2 and D2_6, such a test is also called a 4-bit compressed test.

The signal combination section 21_5 outputs a common fail detection signal DET_COUTB by combining the plurality of sub common fail detection signals DET_C1B-DET_C4B. The signal combination section 21_5 outputs the common fail detection signal DET_COUTB by ANDing the plurality of sub common fail detection signals DET_C1B-DET_C4B. In this embodiment, the signal combination section 21_5 may include an ANDing element AND0. If the second to fourth sub common fail detection signals DET_C2B-DET_C4B are deactivated to a high level and only the first sub command fail detection signal DET_C1B is activated to a low level, the common fail detection signal DET_COUTB is activated to a low level and the error detecting unit outputs a detection result that the corresponding block of the first and second blocks 100A and 100B have failed.

Therefore, since the repair operation is performed based on the common fail detection signal DET_COUTB, the corresponding block of the first and second blocks 100A and 100B are simultaneously replaced with the redundancy groups. In such a repair operation, the first and second blocks 100A and 100B are simultaneously replaced with the redundancy groups when any one of the first and second blocks 100A and 100B is detected as failed.

FIG. 3 is a truth table illustrating an operation of the error detecting unit in FIG. 2.

FIG. 3 shows the result from the internal operation of the first sub common fail detection section 21_1. The internal operation of the first sub common fail detection section 21_1 will be described with reference to the truth table in FIG. 3 and FIG. 2. It is assumed that the blocks 100A and 100B are normal when the four test data signals D1_2, D1_6, D2_2 and D2_6 are outputted as '0'.

First, when the four test data signals D1_2, D1_6, D2_2 and D2_6 are '0', the first sub common fail detection signal DET_C1B is deactivated to a high level and thus a detection result that no fail is detected is outputted.

Next, when any one of the four test data signals D1_2, D1_6, D2_2 and D2_6 is '1', the first sub common fail detection signal DET_C1B is activated to a low level and thus a detection result that the fail is detected is outputted.

Figure 4:
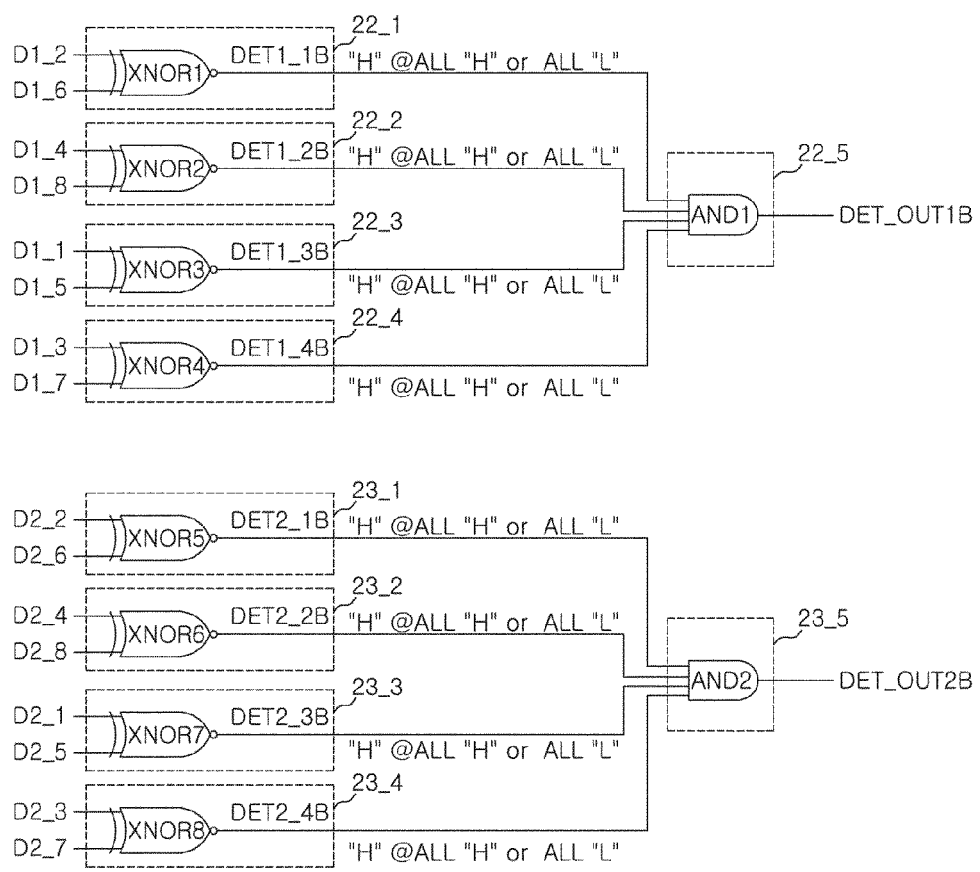
FIG. 4 is a diagram illustrating a configuration of the error detecting unit in FIG. 1 in accordance with a second embodiment of the present invention.

Next, when the four test data signals D1_2, D1_6, D2_2 and D2_6 are '1', the fail must be detected. However, the first sub common fail detection signal DET_C1B is deactivated to a high level and thus a detection result that it is normal is outputted. The probability that the 4-bit compressed test performs such incorrect determination is arithmetically 6.25%. FIG. 4 is a diagram illustrating a configuration of the error detecting unit in FIG. 1 in accordance with a second embodiment of the present invention.

Referring to FIG. 4, the error detecting unit may include a first fail detection section 22_1-22_5 and a second fail detection section 23_1-23_5.

The first fail detection section 22_1-22_5 detects the fail of the first block 100A by combining the plurality of first test data signals D1_1-D1_8 outputted from the first block 100A. The first fail detection section 22_1-22_5 may include a plurality of first sub fail detection sections 22_1-22_4 and a first signal combination section 22_5. The plurality of first sub fail detection sections 22_1-22_4 combine the plurality of first test data signals D1_1-D1_8 as many as the allocated number, and output a plurality of first sub fail detection signals DET1_1B-DET1_4B.

Since the plurality of first sub fail detection sections 21_1-21_4 have the same configuration and perform the same operation, the first sub fail detection section 21_1 will be representatively described.

The first sub fail detection section 21_1 includes an XNOR logic. The first sub fail detection section 21_1 outputs the first sub fail detection signal DET1_1B by XNORing the two test data signals D1_2 and D1_6, which are allocated thereto among the plurality of first test data signals D1_1-D1_8. Therefore, when the two test data signals D1_2 and D1_6 have the same data value, the first sub fail detection signal DET1_1B is deactivated to a high level. This means that no fail is detected. When the two test data signals D1_2 and D1_6 have a different data value, the first sub fail detection signal DET1_1B is activated to a low level. This means that the fail is detected. Since the fail is detected by combining the two test data signals D1_2 and D1_6, such a test is also called a 2-bit compressed test.

The first signal combination section 22_5 outputs a first fail detection signal DET_OUT1B by combining the plurality of first sub fail detection signals DET1_1B-DET1_4B. The first signal combination section 22_5 outputs the first fail detection signal DET_OUT1B by ANDing the plurality of first sub fail detection signals DET1_1B-DET1_4B. In this embodiment, the first signal combination section 22_5 may include an ANDing element AND1. If three of the first sub fail detection signals DET1_2B-DET1_4B are deactivated to a high level and only one of the first sub fail detection signal DET1_1B is activated to a low level, the first fail detection signal DET_OUT1B is activated to a low level and the test unit outputs a detection result that the first block 100A have failed. That is, when any one of the plurality of first sub fail detection signals DET1_1B-DET1_4B is activated to a low level, the first fail detection signal DET_OUT1B is activated to a low level and thus the test unit outputs a detection result that the first block 100A have failed.

The second fail detection section 23_1-23_5 detects the fail of the second block 100B by combining the plurality of second test data signals D2_1-D2_8 outputted from the second block 100B. The second fail detection section 23_1-23_5 may include a plurality of second sub fail detection sections 23_1-23_4 and a second signal combination section 23_5. The plurality of second sub fail detection sections 23_1-23_4 combine the plurality of second test data signals D2_1-D2_8 as many as the allocated number, and output a plurality of second sub fail detection signals DET2_1B-DET2_4B.

Since the plurality of second sub fail detection sections 23_1-23_4 have the same configuration and perform the same operation, the second sub fail detection section 23_1 will be representatively described.

The second sub fail detection section 23_1 includes an XNOR logic. The second sub fail detection section 23_1 outputs the second sub fail detection signal DET2_1B by performing an XNOR operation on the two test data signals D2_2 and D2_6, which are allocated thereto among the plurality of second test data signals D2_1-D2_8. Therefore, when the two test data signals D2_2 and D2_6 have the same data value, the second sub fail detection signal DET2_1B is deactivated to a high level. This means that no fail is detected. When the two test data signals D2_2 and D2_6 have a different data value, the second sub fail detection signal DET2_1B is activated to a low level. This means that the fail is detected.

The second signal combination section 23_5 outputs a second fail detection signal DET_OUT2B by combining the plurality of second sub fail detection signals DET2_1B-DET2_4B. The second signal combination section 23_5 outputs the second fail detection signal DET_OUT2B by ANDing the plurality of second sub fail detection signals DET2_1B-DET2_4B. In this embodiment, the second signal combination section 23_5 may include an ANDing element AND2. If three of the second sub fail detection signals DET2_2B-DET2_4B are deactivated to a high level and only one of the second sub fail detection signal DET2_1B is activated to a low level, the second fail detection signal DET_OUT2B is activated to a low level and the error detecting unit outputs a detection result that the second block 100B have failed. That is, when any one of the plurality of second sub fail detection signals DET2_1B-DET2_4B is activated to a low level, the second fail detection signal DET_OUT2B is activated to a low level and thus the error detecting unit outputs a detection result that the second block 100B have failed.

Therefore, since the repair operation is performed based on the first fail detection signal DET_OUT1B and the second fail detection signal DET_OUT2B, the first block 100A and the second block 100B are respectively replaced with the redundancy groups. In such a repair operation, when any one of the first and second blocks 100A and 100B is detected as a failed block, only the failed the block is replaced with the redundancy groups.

FIG. 5 is a truth table illustrating an operation of the error detecting unit in FIG. 4.

FIG. 5 shows the result from the internal operation of the first sub fail detection section 22_1 and the second sub fail detection section 23_1. The internal operation of the first sub fail detection section 21_1 and the second sub fail detection section 23_1 will be described with reference to the truth table in FIG. 5 and FIG. 4. It is assumed that the blocks 100A and 100B are normal when the two first test data signals D1_2 and D1_6 are outputted as '0.' The two second test data signals D2_2 and D2_6 inputted to the second sub fail detection section 23_1 are shown for reference. Also, it is assumed that the first sub fail detection section 22_1 and the second sub fail detection section 23_1 are operated as a set.

First, when the two first test data signals D1_2 and D1_6 are '0', the first sub fail detection signal DET1_1B is deactivated to a high level and thus a detection result that no fail is detected is outputted.

Next, when any one of the two first test data signals D1_2 and D1_6 is '1', the first sub fail detection signal DET1_1B is activated to a low level and thus a detection result that the fail is detected is outputted.

Next, when the two first test data signals D1_2 and D1_6 are '1', the fail must be detected. However, the first sub fail detection signal DET1_1B is deactivated to a high level and thus a detection result that it is normal is outputted. The probability that the 2-bit compressed test performs an incorrect determination is arithmetically 25%.

Figure 6:
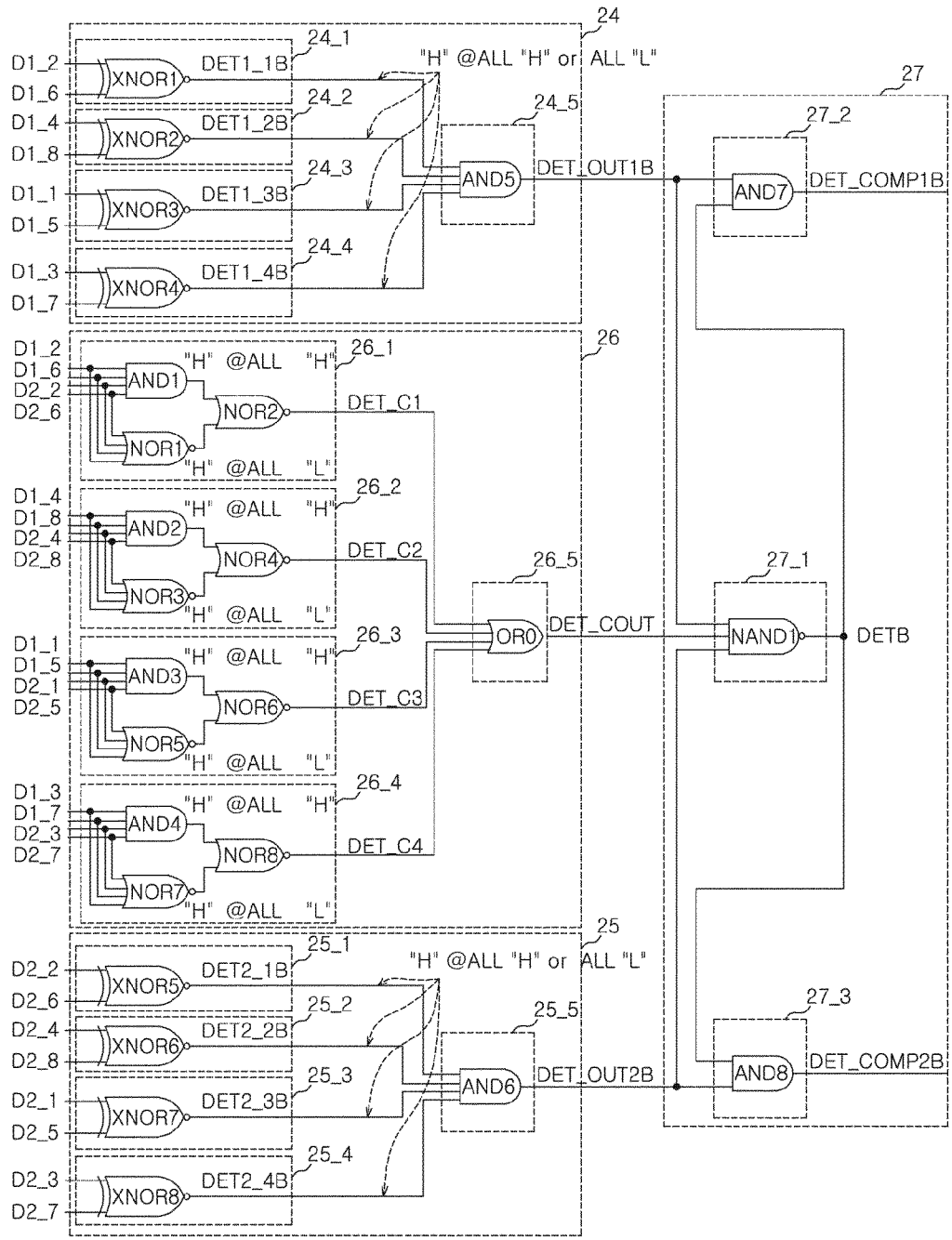
FIG. 6 is a diagram illustrating a configuration of the error detecting unit in FIG. 1 in accordance with a third embodiment of the present invention.

FIG. 6 is a diagram illustrating a configuration of the error detecting unit in FIG. 1 in accordance with a third embodiment of the present invention.

Referring to FIG. 6, the error detecting unit may include a first fail detection section 24, a second fail detection section 25, a common fail detection section 26, and a fail determination section 27.

The detailed configuration and principal operation of the error detecting unit configured as above will be described below.

The first fail detection section 24 detects the fail of the first block 100A by combining a plurality of first test data signals D1_1-D1_8 outputted from the first block 100A. That is, the first fail detection section 24 detects the fail based on the plurality of first test data signals D1_1-D1_8 and activates a first fail detection signal DET_OUT1B to a low level when the fail is detected. Since the first fail detection section 24 may have substantially identical configuration with the first fail detection section 22_1-22_5 of the error detecting unit in FIG. 4, duplicate description thereof will be omitted.

The second fail detection section 25 detects the fail of the second block 100B by combining a plurality of second test data signals D2_1-D2_8 outputted from the second block 100B. That is, the second fail detection section 25 detects the fail based on the plurality of second test data signals D2_1-D2_8 and activates a second fail detection signal DET_OUT2B to a low level when the fail is detected. Since the second fail detection section 25 may have substantially identical configuration with the second fail detection section 23_1-23_5 of the error detecting unit in FIG. 4, duplicate description thereof will be omitted.

The common fail detection section 26 detects the fail of the first and second blocks 100A and 100B simultaneously by combining the plurality of first test data signals D1_1-D1_8, which are outputted from the first block 100A, and the plurality of second test data signals D2_1-D2_8, which are outputted from the second block 100B.

When any one of the first block 100A and the second block 100B is failed, the common fail detection section 26 outputs a detection result that all of the first and second blocks 100A and 100B have failed.

The common fail detection section 26 may include a plurality of sub common fail detection sections 26_1-26_4 and a signal combination section 26_5. The plurality of sub common fail detection sections 26_1-26_4 combine the plurality of first test data signals D1_1-D1_8 and the plurality of second test data signals D2_1-D2_8 as many as the allocated number, and output a plurality of sub common fail detection signals DET_C1-DET_C4. Since the plurality of sub common fail detection sections 26_1-26_4 have the same configuration and perform the same operation, the first sub common fail detection section 26_1 will be representatively described.

The first sub common fail detection section 26_1 may include an XNOR logic. The XNOR logic includes an ANDing element AND1, a first NORing element NOR1, and a second NORing element NOR2.

The first sub common fail detection section 26_1 outputs the first sub common fail detection signal DET_C1 by performing an XNOR operation on the two test data signals D1_2 and D1_6, which are allocated thereto among the plurality of first test data signals D1_1-D1_8 outputted from the first block 100A, and the two test data signals D2_2 and D2_6 which are allocated thereto among the plurality of second test data signals D2_1-D2_8 outputted from the second block 100B. Therefore, when the four test data signals D1_2, D1_6, D2_2 and D2_6 have the same data value, the first sub common fail detection signal DET_C1 is deactivated to a low level. This means that no fail is detected. When any one of the four test data signals D1_2, D1_6, D2_2 and D2_6 has a different data value, the first sub common fail detection signal DET_C1 is activated to a high level. This means that the fail is detected. Since the fail is detected by combining the four test data signals D1_2, D1_6, D2_2 and D2_6, such a test is also called a 4-bit compressed test.

The signal combination section 26_5 outputs a common fail detection signal DET_COUT by combining the plurality of sub common fail detection signals DET_C1-DET_C4. The signal combination section 26_5 outputs the common fail detection signal DET_COUT by ANDing the plurality of sub common fail detection signals DET_C1-DET_C4. In this embodiment, the signal combination section 26_5 may include an ORing element OR0. If the second to fourth sub common fail detection signals DET_C2-DET_C4 are deactivated to a low level and only the first sub common fail detection signal DET_C1 is activated to a high level, the common fail detection signal DET_COUT is activated to a high level and the error detecting unit outputs a detection result that the corresponding block of the first and second memory blocks 100A and 100B have failed.

The fail determination section 27 outputs the fail detection results of the first and second fail detection sections 24 and 25 or the fail detection result of the common fail detection section 26 as a final fail detection result according to the fail detection results of the first and second fail detection sections 24 and 25. When one of the first fail detection section 24 and the second fail detection section 25 detects the fail of the corresponding memory block, the fail determination section 27 outputs the detection result of the fail detection section, which detects the fail, as the final fail detection result. When the first fail detection section 24 and the second fail detection section 25 detect no fail in the corresponding blocks, the fail determination section 27 outputs the detection result of the common fail detection section 26 as the final fail detection result.

In this embodiment, the fail determination section 27 may include a fail detection combination section 27_1, a first signal output section 27_2, and a second signal output section 27_3.

The fail detection combination section 27_1 outputs a fail combination signal DETB by combining the first fail detection signal DET_OUT1B outputted from the first fail detection section 24, the second fail detection signal DET_OUT2B outputted from the second fail detection section 25, and the common fail detection signal DET_COUT outputted from the common fail detection section 26. The fail detection combination section 27_1 may include a NANDing element NAND1 configured to output the fail combination signal DETB by NANDing the first fail detection signal DET_OUT1B, the second fail detection signal DET_OUT2B, and the common fail detection signal DET_COUT.

The first signal output section 27_2 outputs a first final fail detection signal DET_COMP1B by combining the fail combination signal DETB and the first fail detection signal DET_OUT1B. The first signal output section 27_2 may include an ANDing element AND7 configured to output the first final fail detection signal DET_COMP1B by ANDing the fail combination signal DETB and the first fail detection signal DET_OUT1B.

The second signal output section 27_3 outputs a second final fail detection signal DET_COMP2B by combining the fail combination signal DETB and the second fail detection signal DET_OUT2B. The second signal output section 27_3 may include an ANDing element AND8 configured to output the second final fail detection signal DET_COMP2B by ANDing the fail combination signal DETB and the second fail detection signal DET_OUT2B.

The detailed internal operation of the fail determination section 27 will be described below.

First, it is assumed that one of the first fail detection signal DET_OUT1B and the second fail detection signal DET_OUT2B is activated to a low level. Thus the signal indicates that the fail occurs in the first block 100A or the second block 100B. Further, it is assumed that the first fail detection signal DET_OUT1B is activated to a low level and thus the fail occurs in the first block 100A.

Since the first fail detection signal DET_OUT1B is activated to a low level, the fail detection combination section 27_1 outputs the fail combination signal DETB having a high level. Therefore, the first signal output section 27_2 activates the first final fail detection signal DET_COMP1B to a low level. The fail determination section 27 indicates through the first final fail detection signal DET_COMP1B that the fail occurs in the first block 100A. That is, when one of the first fail detection section 24 and the second fail detection section 25 detects the fail of the corresponding block, the fail determination section 27 outputs the detection result of the fail detection section detecting the fail as the final fail detection result.

Next, it is assumed that the first fail detection signal DET_OUT1B and the second fail detection signal DET_OUT2B are deactivated to a high level. Thus the signals indicate that the first block 100A or the second block 100B is normal. Further it is assumed that, in spite of the signals' indication, a fail occurs in any one block, which means that a determination error occurs in the 2-bit compressed test.

Since the first fail detection signal DET_OUT1B and the second fail detection signal DET_OUT2B are deactivated to a high level, the fail combination signal DETB outputted from the fail detection combination section 27_1 is determined by the level of the common fail detection signal DET_COUT. When the common fail detection signal DET_COUT is activated to a high level since the fail is detected, the fail detection combination section 27_1 outputs the fail combination signal DETB having a low level. Accordingly, the first signal output section 27_2 activates the first final fail detection signal DET_COMP1B to a low level, and the second signal output section 27_3 activates the second final fail detection signal DET_COMP2B to a low level. The fail determination section 27 indicates through the first and second final fail detection signals DET_COMP1B and DET_COMP2B that the fail occurs in the first and second blocks 100A and 100B. In other words, when the first fail detection section 24 and the second fail detection section 25 detect no fail of the corresponding blocks, the fail determination section 27 outputs the detection result of the common fail detection section 26 as the final fail detection result. Therefore, the fail determination section 27 reduces the determination error by outputting the detection result of the common fail detection section 26 even though the fail detection section 24 and the second fail detection section 25 make an incorrect determination.

When the repair operation of the semiconductor apparatus is performed based on the first final fail detection signal DET_COMP1B and the second final fail detection signal DET_COMP2B, a failed block may be replaced with the redundancy groups. That is, upon the operation of repairing the first and second blocks 100A and 100B based on the final fail detection result outputted from the fail determination section 27, when the fail determination section 27 outputs the fail detection result of the first fail detection section 24 or the second fail detection section 25 as the final fail detection result, the repair circuit of the semiconductor apparatus performs an operation of replacing only the failed block with the redundancy group. When the fail determination section 27 outputs the fail detection result of the common fail detection section 26 as the final fail detection result, the repair circuit of the semiconductor apparatus performs an operation of simultaneously replacing the corresponding block of the first and second blocks 100A and 100B with the redundancy groups. Therefore, the semiconductor apparatus including the error detecting unit in FIG. 6 may reduce the fail determination error, and replace only the failed block with the redundancy group, thereby improving the repair efficiency.

Figure 7:
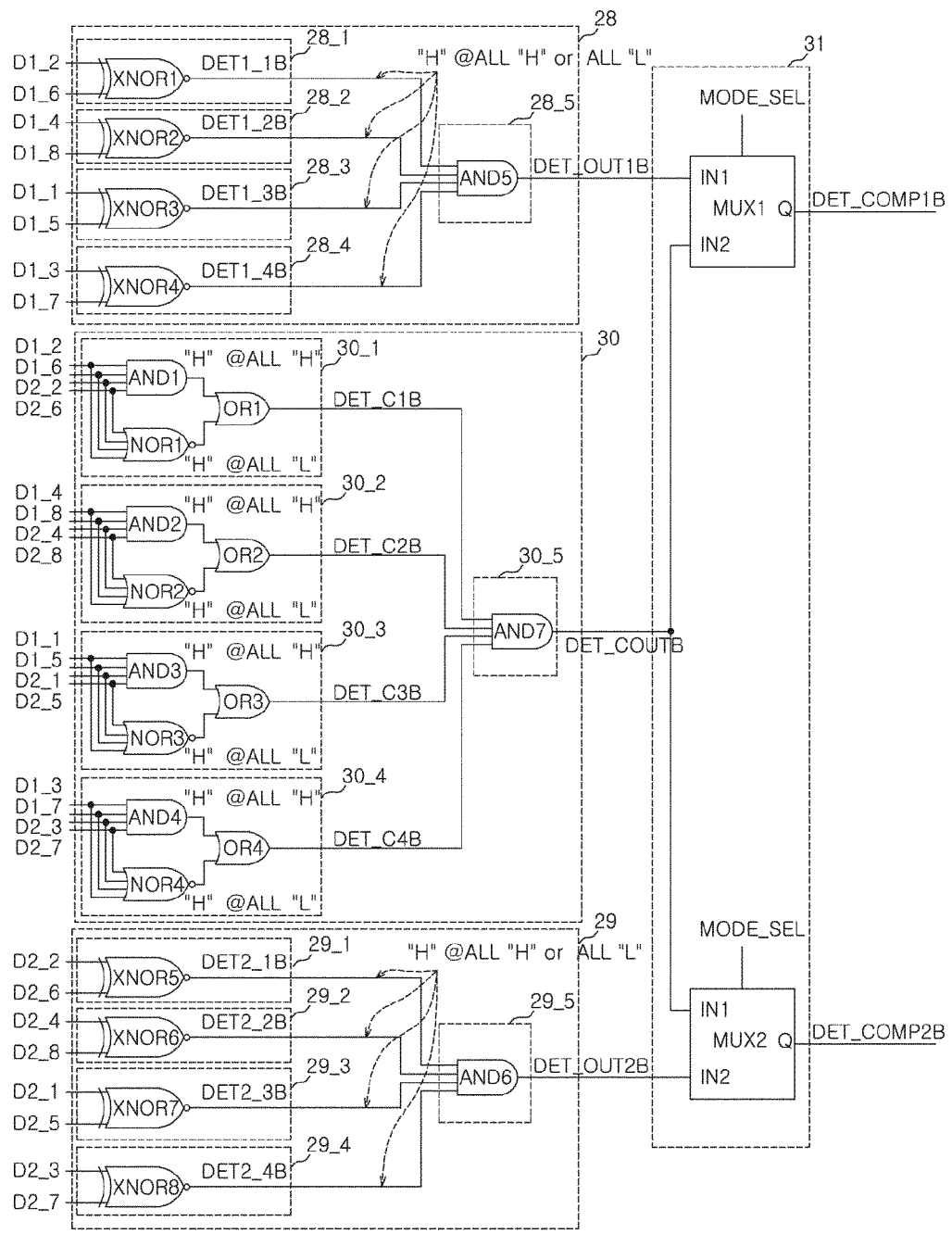
FIG. 7 is a diagram illustrating a configuration of the error detecting unit in FIG. 1 in accordance with a fourth embodiment of the present invention.

FIG. 7 is a diagram illustrating a configuration of the error detecting unit in FIG. 1 in accordance with a fourth embodiment of the present invention.

Referring to FIG. 7, the error detecting unit may include a first fail detection section 28, a second fail detection section 29, a common fail detection section 30, and a selection section 31. Since the first fail detection section 28, the second fail detection section 29, and the command fail detection section 30 have been described in detail through the operations of the error detecting units according to the first to third embodiments, duplicate description thereof will be omitted and only their principal operations will be described below.

The first fail detection section 28 detects the fail of the first block 100A by combining a plurality of first test data signals D1_1-D1_8 outputted from the first block 100A. That is, the first fail detection section 28 detects the fail based on the plurality of first test data signals D1_1-D1_8 and activates a first fail detection signal DET_OUT1B to a low level when the fail is detected.

The second fail detection section 29 detects the fail of the second block 100B by combining a plurality of second test data signals D2_1-D2_8 outputted from the second block 100B. That is, the second fail detection section 29 detects the fail based on the plurality of second test data signals D2_1-D2_8 and activates a second fail detection signal DET_OUT2B to a low level when the fail is detected.

The common fail detection section 30 simultaneously detects the fail of the first and second blocks 100A and 100B by combining the plurality of first test data signals D1_1-D1_8, which are outputted from the first block 100A, and the plurality of second test data signals D2_1-D2_8, which are outputted from the second block 100B. When the fail is detected, the common fail detection section 30 activates the common fail detection signal DET_COUTB to a low level.

The selection section 31 outputs the detection results of the first and second fail detection sections 28 and 29 or the detection result of the common fail detection section 30 as a final fail detection result according to a mode selection signal MODE_SEL. The mode selection signal MODE_SEL is a selection signal for determining the fail detection section whose fail detection result is to be outputted. The mode selection signal MODE_SEL may be defined as a signal directly inputted from a mode register set (MRS), a repair related control circuit or the outside. Also, the mode selection signal MODE_SEL may be defined as a signal representing a wafer test or a package test.

The selection section 31 may include a plurality of switches MUX1 and MUX2. When the mode selection signal MODE_SEL is activated, the plurality of switches MUX1 and MUX2 output the common fail detection signal DET_COUTB outputted from the common fail detection section 30 as the final fail detection signals DET_COMP1B and DET_COMP2B. When the mode selection signal MODE_SEL is deactivated, the plurality of switches MUX1 and MUX2 output the first fail detection signal DET_OUT1B outputted from the first fail detection section 28 and the second fail detection signal DET_OUT2B outputted from the second fail detection section 29 as the final fail detection signals DET_COMP1B and DET_COMP2B.

As described above, the error detecting circuit of the semiconductor apparatus can improve the fail detection rate and the repair efficiency.

Figure 8:
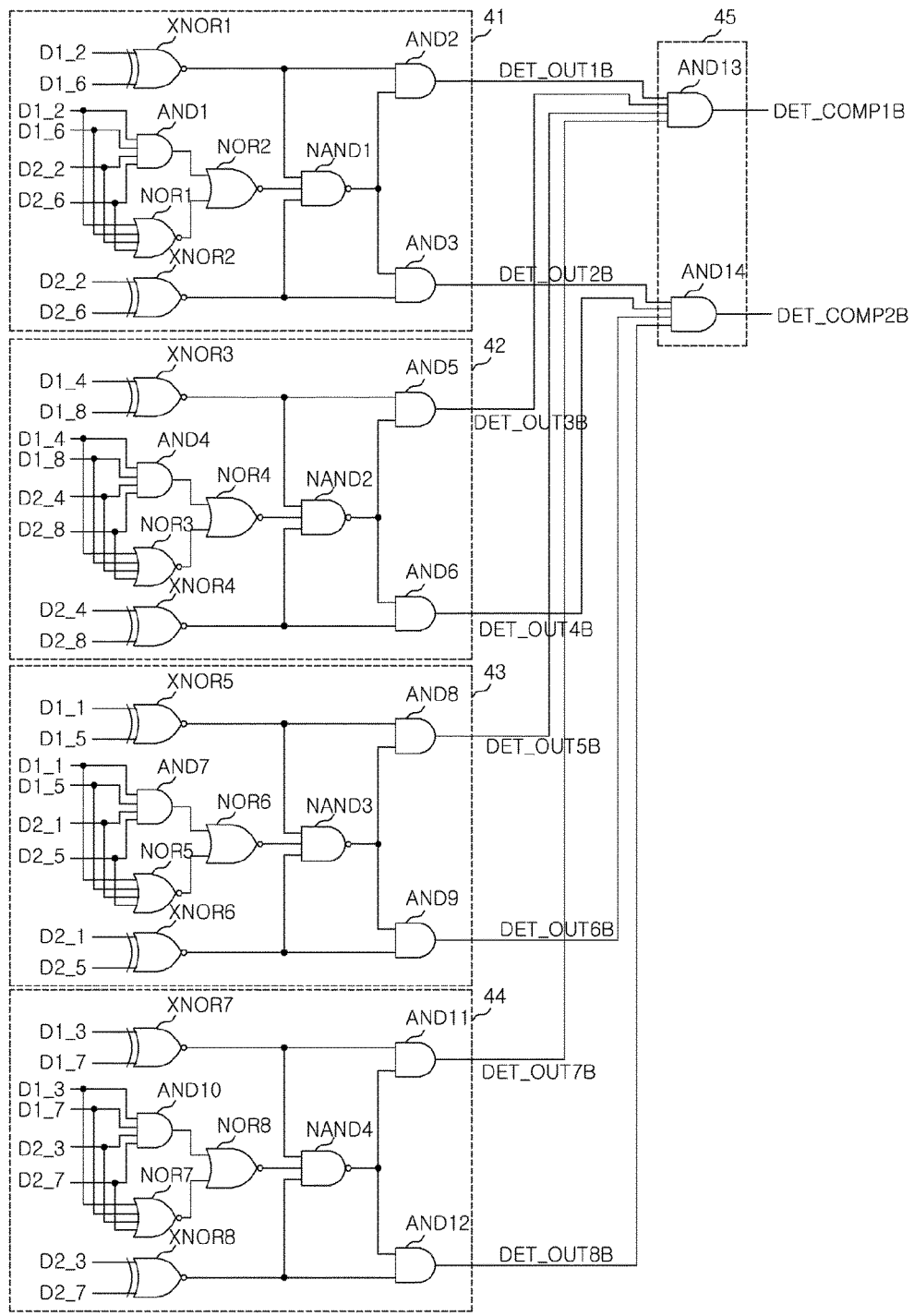
FIG. 8 is a diagram showing a configuration of the error detecting unit of FIG. 1 in accordance with a fifth embodiment of the present invention.

Referring to FIG. 8, the error detecting unit 200 includes first to fourth fail detecting sections 41 to 44 and a fail determining section 45.

The detailed configuration and principal operations of the error detecting unit 200 configured in this way will be described below.

The first fail detecting section 41 is configured to combine corresponding test data signals D1_2 and D1_6 among a plurality of first test data signals D1_1 to D1_8 outputted from the first block 100A and corresponding test data signals D2_2 and D2_6 among a plurality of second test data signals D2_1 to D2_8 outputted from the second block 100B, and generate first and second fail detection signals DET_OUT1B and DET_OUT2B. For example, the first fail detecting section 41 receives a second test data signal D1_2 and a sixth test data signal D1_6 among the plurality of first test data signals D1_1 to D1_8. Also, the first fail detecting section 41 receives a second test data signal D2_2 and a sixth test data signal D2_6 among the plurality of second test data signals D2_1 to D2_8.

The first fail detecting section 41 includes first and second exclusive NOR gates XNOR1 and XNOR2, first to third AND gates AND1, AND2 and AND3, first and second NOR gates NOR1 and NOR2, and a first NAND gate NAND1. The first exclusive NOR gate XNOR1 receives the second and sixth test data signals D1_2 and D1_6 among the plurality of first test data signals D1_1 to D1_8. The second exclusive NOR gate XNOR2 receives the second and sixth test data signals D2_2 and D2_6 among the plurality of second test data signals D2_1 to D2_8. The first AND gate AND1 receives the second and sixth test data signals D1_2 and D1_6 among the plurality of first test data signals D1_1 to D1_8 and the second and sixth test data signals D2_2 and D2_6 among the plurality of second test data signals D2_1 to D2_8. The first NOR gate NOR1 receives the second and sixth test data signals D1_2 and D1_6 among the plurality of first test data signals D1_1 to D1_8 and the second and sixth test data signals D2_2 and D2_6 among the plurality of second test data signals D2_1 to D2_8. The second NOR gate NOR2 receives the output signals of the first AND gate AND1 and the first NOR gate NOR1. The first NAND gate NAND1 receives the output signals of the first and second exclusive NOR gates XNOR1 and XNOR2 and the output signal of the second NOR gate NOR2. The second AND gate AND2 receives the output signals of the first exclusive NOR gate XNOR1 and the first NAND gate NAND1 and outputs the first fail detection signal DET_OUT1B. The third AND gate AND3 receives the output signals of the second exclusive NOR gate XNOR2 and the first NAND gate NAND1 and outputs the second fail detection signal DET_OUT2B.

The first fail detecting section 41 configured in this way operates as follows.

If both the second and sixth test data signals D1_2 and D1_6 among the plurality of first test data signals D1_1 to D1_8 are signals with the same level, the first exclusive NOR gate XNOR1 outputs a signal of a high level.

If both the second and sixth test data signals D2_2 and D2_6 among the plurality of second test data signals D2_1 to D2_8 are signals with the same level, the second exclusive NOR gate XNOR2 outputs a signal of a high level.

If all of the second and sixth test data signals D1_2 and D1_6 among the plurality of first test data signals D1_1 to D1_8 and the second and sixth test data signals D2_2 and D2_6 among the plurality of second test data signals D2_1 to D2_8 are signals with the same level, the second NOR gate NOR2 outputs a signal of a low level. Meanwhile, even any one of the second and sixth test data signals D1_2 and D1_6 among the plurality of first test data signals D1_1 to D1_8 and the second and sixth test data signals D2_2 and D2_6 among the plurality of second test data signals D2_1 to D2_8 has a different level, the second NOR gate NOR2 outputs a signal of a high level.

In the case where all of the second and sixth test data signals D1_2 and D1_6 among the plurality of first test data signals D1_1 to D1_8 and the second and sixth test data signals D2_2 and D2_6 among the plurality of second test data signals D2_1 to D2_8 have low levels, the first and second exclusive NOR gates XNOR1 and XNOR2 respectively output signals of high levels. Also, the second NOR gate NOR2 outputs a signal of a low level. The first NAND gate NAND1, which receives the output signals of the first and second exclusive NOR gates XNOR1 and XNOR2 and the output signal of the second NOR gate NOR2, outputs a signal of a high level. The second AND gate AND2, which receives the output signals of the first exclusive NOR gate XNOR1 and the first NAND gate NAND1, outputs the first fail detection signal DET_OUT1B of a high level. The third AND gate AND3, which receives the output signals of the second exclusive NOR gate XNOR2 and the first NAND gate NAND1, outputs the second fail detection signal DET_OUT2B of a high level.

In the case where all of the second and sixth test data signals D1_2 and D1_6 among the plurality of first test data signals D1_1 to D1_8 and the second and sixth test data signals D2_2 and D2_6 among the plurality of second test data signals D2_1 to D2_8 have high levels, the first and second exclusive NOR gates XNOR1 and XNOR2 respectively output signals of high levels. Also, the second NOR gate NOR2 outputs a signal of a low level. The first NAND gate NAND1, which receives the output signals of the first and second exclusive NOR gates XNOR1 and XNOR2 and the output signal of the second NOR gate NOR2, outputs a signal of a high level. The second AND gate AND2, which receives the output signals of the first exclusive NOR gate XNOR1 and the first NAND gate NAND1, outputs the first fail detection signal DET_OUT1B of a high level. The third AND gate AND3, which receives the output signals of the second exclusive NOR gate XNOR2 and the first NAND gate NAND1, outputs the second fail detection signal DET_OUT2B of a high level.

In the case where the second and sixth test data signals D1_2 and D1_6 among the plurality of first test data signals D1_1 to D1_8 have different levels and both the second and sixth test data signals D2_2 and D2_6 among the plurality of second test data signals D2_1 to D2_8 have the same level, the first exclusive NOR gate XNOR1 outputs a signal of a low level. The second exclusive NOR gate XNOR2 outputs a signal of a high level. The second NOR gate NOR2 outputs a signal of a high level. The first NAND gate NAND1, which receives the output signals of the first and second exclusive NOR gates XNOR1 and XNOR2 and the output signal of the second NOR gate NOR2, outputs a signal of a high level. The second AND gate AND2, which receives the output signals of the first exclusive NOR gate XNOR1 and the first NAND gate NAND1, outputs the first fail detection signal DET_OUT1B of a low level. The third AND gate AND3, which receives the output signals of the second exclusive NOR gate XNOR2 and the first NAND gate NAND1, outputs the second fail detection signal DET_OUT2B of a high level.

In the case where both the second and sixth test data signals D1_2 and D1_6 among the plurality of first test data signals D1_1 to D1_8 have the same level and the second and sixth test data signals D2_2 and D2_6 among the plurality of second test data signals D2_1 to D2_8 have different levels, the first exclusive NOR gate XNOR1 outputs a signal of a high level. The second exclusive NOR gate XNOR2 outputs a signal of a low level. The second NOR gate NOR2 outputs a signal of a high level. The first NAND gate NAND1, which receives the output signals of the first and second exclusive NOR gates XNOR1 and XNOR2 and the output signal of the second NOR gate NOR2, outputs a signal of a high level. The second AND gate AND2, which receives the output signals of the first exclusive NOR gate XNOR1 and the first NAND gate NAND1, outputs the first fail detection signal DET_OUT1B of a high level. The third AND gate AND3, which receives the output signals of the second exclusive NOR gate XNOR2 and the first NAND gate NAND1, outputs the second fail detection signal DET_OUT2B of a low level.

In the case where both the second and sixth test data signals D1_2 and D1_6 among the plurality of first test data signals D1_1 to D1_8 have the same level, both the second and sixth test data signals D2_2 and D2_6 among the plurality of second test data signals D2_1 to D2_8 have the same level, and the second and sixth test data signals D1_2 and D1_6 among the plurality of first test data signals D1_1 to D1_8 and the second and sixth test data signals D2_2 and D2_6 among the plurality of second test data signals D2_1 to D2_8 have different levels, the first exclusive NOR gate XNOR1 outputs a signal of a high level. The second exclusive NOR gate XNOR2 outputs a signal of a high level. The second NOR gate NOR2 outputs a signal of a high level. The first NAND gate NAND1, which receives the output signals of the first and second exclusive NOR gates XNOR1 and XNOR2 and the output signal of the second NOR gate NOR2, outputs a signal of a low level. The second AND gate AND2, which receives the output signals of the first exclusive NOR gate XNOR1 and the first NAND gate NAND1, outputs the first fail detection signal DET_OUT1B of a low level. The third AND gate AND3, which receives the output signals of the second exclusive NOR gate XNOR2 and the first NAND gate NAND1, outputs the second fail detection signal DET_OUT2B of a low level.

In the case where the second and sixth test data signals D1_2 and D1_6 among the plurality of first test data signals D1_1 to D1_8 have different levels and the second and sixth test data signals D2_2 and D2_6 among the plurality of second test data signals D2_1 to D2_8 have different levels, the first exclusive NOR gate XNOR1 outputs a signal of a low level. The second exclusive NOR gate XNOR2 outputs a signal of a low level. The second NOR gate NOR2 outputs a signal of a high level. The first NAND gate NAND1, which receives the output signals of the first and second exclusive NOR gates XNOR1 and XNOR2 and the output signal of the second NOR gate NOR2, outputs a signal of a high level. The second AND gate AND2, which receives the output signals of the first exclusive NOR gate XNOR1 and the first NAND gate NAND1, outputs the first fail detection signal DET_OUT1B of a low level. The third AND gate AND3, which receives the output signals of the second exclusive NOR gate XNOR2 and the first NAND gate NAND1, outputs the second fail detection signal DET_OUT2B of a low level.

That is to say, if the levels of the first test data signals D1_2 and D1_6 among the first and second test data signals D1_2, D1_6, D2_2 and D2_6 of the first and second blocks 100A and 100B, which are inputted to the first fail detecting section 41, are different from each other, that is, if a 1-bit fail occurs in the first block 100A, the first fail detecting section 41 disables the first fail detection signal DET_OUT1B of the first and second fail detection signals DET_OUT1B and DET_OUT2B, to a low level. Meanwhile, if the levels of the second test data signals D2_2 and D2_6 among the first and second test data signals D1_2, D1_6, D2_2 and D2_6 of the first and second blocks 100A and 100B, which are inputted to the first fail detecting section 41, are different from each other, that is, if a 1-bit fail occurs in the second block 100B, the first fail detecting section 41 disables the second fail detection signal DET_OUT2B of the first and second fail detection signals DET_OUT1B and DET_OUT2B, to a low level.

Moreover, if all of the levels of the first and second test data signals D1_2, D1_6, D2_2 and D2_6 of the first and second blocks 100A and 100B, which are inputted to the first fail detecting section 41, are the same with one another, that is, if both the first and second blocks 100A and 100B are normal, the first fail detecting section 41 enables both the first and second fail detection signals DET_OUT1B and DET_OUT2B to high levels.

Furthermore, in the case where, among the first and second test data signals D1_2, D1_6, D2_2 and D2_6 of the first and second blocks 100A and 100B which are inputted to the first fail detecting section 41, the first test data signals D1_2 and D1_6 have the same level, the second test data signals D2_2 and D2_6 have the same level and the first test data signals D1_2 and D1_6 and the second test data signals D2_2 and D2_6 have different levels, that is, in the case where one block of the first and second blocks 100A and 100B fails by 2 bits, the first fail detecting section 41 disables both the first and second fail detection signals DET_OUT1B and DET_OUT2B to low levels.

The second fail detecting section 42 is configured to combine corresponding test data signals D1_4 and D1_8 among the plurality of first test data signals D1_1 to D1_8 outputted from the first block 100A and corresponding test data signals D2_4 and D2_8 among the plurality of second test data signals D2_1 to D2_8 outputted from the second block 100B, and generate third and fourth fail detection signals DET_OUT3B and DET_OUT4B. For example, the second fail detecting section 42 receives a fourth test data signal D1_4 and an eighth test data signal D1_8 among the plurality of first test data signals D1_1 to D1_8. Also, the second fail detecting section 42 receives a fourth test data signal D2_4 and an eighth test data signal D2_8 among the plurality of second test data signals D2_1 to D2_8.

The second fail detecting section 42 includes third and fourth exclusive NOR gates XNOR3 and XNOR4, fourth to sixth AND gates AND4, AND5 and AND6, third and fourth NOR gates NOR3 and NOR4, and a second NAND gate NAND2. The third exclusive NOR gate XNOR3 receives the fourth and eighth test data signals D1_4 and D1_8 among the plurality of first test data signals D1_1 to D1_8. The fourth exclusive NOR gate XNOR4 receives the fourth and eighth test data signals D2_4 and D2_8 among the plurality of second test data signals D2_1 to D2_8. The fourth AND gate AND4 receives the fourth and eighth test data signals D1_4 and D1_8 among the plurality of first test data signals D1_1 to D1_8 and the fourth and eighth test data signals D2_4 and D2_8 among the plurality of second test data signals D2_1 to D2_8. The third NOR gate NOR3 receives the fourth and eighth test data signals D1_4 and D1_8 among the plurality of first test data signals D1_1 to D1_8 and the fourth and eighth test data signals D2_4 and D2_8 among the plurality of second test data signals D2_1 to D2_8. The fourth NOR gate NOR4 receives the output signals of the fourth AND gate AND4 and the third NOR gate NOR3. The second NAND gate NAND2 receives the output signals of the third and fourth exclusive NOR gates XNOR3 and XNOR4 and the output signal of the fourth NOR gate NOR4. The fifth AND gate AND5 receives the output signals of the third exclusive NOR gate XNOR3 and the second NAND gate NAND2 and outputs the third fail detection signal DET_OUT3B. The sixth AND gate AND6 receives the output signals of the fourth exclusive NOR gate XNOR4 and the second NAND gate NAND2 and outputs the fourth fail detection signal DET_OUT4B.

The second fail detecting section 42 is configured in the same way as the first fail detecting section 41, except the signals inputted thereto and the signals outputted therefrom.

If the levels of the first test data signals D1_4 and D1_8 among the first and second test data signals D1_4, D1_8, D2_4 and D2_8 of the first and second blocks 100A and 100B, which are inputted to the second fail detecting section 42, are different from each other, that is, if a 1-bit fail occurs in the first block 100A, the second fail detecting section 42 disables the third fail detection signal DET_OUT3B of the third and fourth fail detection signals DET_OUT3B and DET_OUT4B, to a low level. Meanwhile, if the levels of the second test data signals D2_4 and D2_8 among the first and second test data signals D1_4, D1_8, D2_4 and D2_8 of the first and second blocks 100A and 100B, which are inputted to the second fail detecting section 42, are different from each other, that is, if a 1-bit fail occurs in the second block 100B, the second fail detecting section 42 disables the fourth fail detection signal DET_OUT4B of the third and fourth fail detection signals DET_OUT3B and DET_OUT4B, to a low level.

Moreover, if all of the levels of the first and second test data signals D1_4, D1_8, D2_4 and D2_8 of the first and second blocks 100A and 100B, which are inputted to the second fail detecting section 42, are the same with one another, that is, if both the first and second blocks 100A and 100B are normal, the second fail detecting section 42 enables both the third and fourth fail detection signals DET_OUT3B and DET_OUT4B to high levels.

Furthermore, in the case where, among the first and second test data signals D1_4, D1_8, D2_4 and D2_8 of the first and second blocks 100A and 100B which are inputted to the second fail detecting section 42, the first test data signals D1_4 and D1_8 have the same level, the second test data signals D2_4 and D2_8 have the same level and the first test data signals D1_4 and D1_8 and the second test data signals D2_4 and D2_8 have different levels, that is, in the case where one block of the first and second blocks 100A and 100B fails by 2 bits, the second fail detecting section 42 disables both the third and fourth fail detection signals DET_OUT3B and DET_OUT4B to low levels.

The third fail detecting section 43 is configured to combine corresponding test data signals D1_1 and D1_5 among the plurality of first test data signals D1_1 to D1_8 outputted from the first block 100A and corresponding test data signals D2_1 and D2_5 among the plurality of second test data signals D2_1 to D2_8 outputted from the second block 100B, and generate fifth and sixth fail detection signals DET_OUT5B and DET_OUT6B. For example, the third fail detecting section 43 receives a first test data signal D1_1 and a fifth test data signal D1_5 among the plurality of first test data signals D1_1 to D1_8. Also, the third fail detecting section 43 receives a first test data signal D2_1 and a fifth test data signal D2_5 among the plurality of second test data signals D2_1 to D2_8.

The third fail detecting section 43 includes fifth and sixth exclusive NOR gates XNOR5 and XNOR6, seventh to ninth AND gates AND7, AND8 and AND9, fifth and sixth NOR gates NOR5 and NOR6, and a third NAND gate NAND3. The fifth exclusive NOR gate XNOR5 receives the first and fifth test data signals D1_1 and D1_5 among the plurality of first test data signals D1_1 to D1_8. The sixth exclusive NOR gate XNOR5 receives the first and fifth test data signals D2_1 and D2_5 among the plurality of second test data signals D2_1 to D2_8. The seventh AND gate AND7 receives the first and fifth test data signals D1_1 and D1_5 among the plurality of first test data signals D1_1 to D1_8 and the first and fifth test data signals D2_1 and D2_5 among the plurality of second test data signals D2_1 to D2_8. The fifth NOR gate NOR5 receives the first and fifth test data signals D1_1 and D1_5 among the plurality of first test data signals D1_1 to D1_8 and the first and fifth test data signals D2_1 and D2_5 among the plurality of second test data signals D2_1 to D2_8. The sixth NOR gate NOR6 receives the output signals of the seventh AND gate AND7 and the fifth NOR gate NOR5. The third NAND gate NAND3 receives the output signals of the fifth and sixth exclusive NOR gates XNOR5 and XNOR6 and the output signal of the sixth NOR gate NOR6. The eighth AND gate AND8 receives the output signals of the fifth exclusive NOR gate XNOR5 and the third NAND gate NAND3 and outputs the fifth fail detection signal DET_OUT5B. The ninth AND gate AND9 receives the output signals of the sixth exclusive NOR gate XNOR6 and the third NAND gate NAND3 and outputs the sixth fail detection signal DET_OUT6B.

The third fail detecting section 43 is configured in the same way as the first fail detecting section 41, except the signals inputted thereto and the signals outputted therefrom.

If the levels of the first test data signals D1_1 and D1_5 among the first and second test data signals D1_1, D1_5, D2_1 and D2_5 of the first and second blocks 100A and 100B, which are inputted to the third fail detecting section 43, are different from each other, that is, if a 1-bit fail occurs in the first block 100A, the third fail detecting section 43 disables the fifth fail detection signal DET_OUT5B of the fifth and sixth fail detection signals DET_OUT5B and DET_OUT6B, to a low level. Meanwhile, if the levels of the second test data signals D2_1 and D2_5 among the first and second test data signals D1_1, D1_5, D2_1 and D2_5 of the first and second blocks 100A and 100B, which are inputted to the third fail detecting section 43, are different from each other, that is, if a 1-bit fail occurs in the second block 100B, the third fail detecting section 43 disables the sixth fail detection signal DET_OUT6B of the fifth and sixth fail detection signals DET_OUT5B and DET_OUT6B, to a low level.

Moreover, if all of the levels of the first and second test data signals D1_1, D1_5, D2_1 and D2_5 of the first and second blocks 100A and 100B, which are inputted to the third fail detecting section 43, are the same with one another, that is, if both the first and second blocks 100A and 100B are normal, the third fail detecting section 43 enables both the fifth and sixth fail detection signals DET_OUT5B and DET_OUT6B to high levels.

Furthermore, in the case where, among the first and second test data signals D1_1, D1_5, D2_1 and D2_5 of the first and second blocks 100A and 100B which are inputted to the third fail detecting section 43, the first test data signals D1_1 and D1_5 have the same level, the second test data signals D2_1 and D2_5 have the same level and the first test data signals D1_1 and D1_5 and the second test data signals D2_1 and D2_5 have different levels, that is, in the case where one block of the first and second blocks 100A and 100B fails by 2 bits, the third fail detecting section 43 disables both the fifth and sixth fail detection signals DET_OUT5B and DET_OUT6B to low levels.

The fourth fail detecting section 44 is configured to combine corresponding test data signals D1_3 and D1_7 among the plurality of first test data signals D1_1 to D1_8 outputted from the first block 100A and corresponding test data signals D2_3 and D2_7 among the plurality of second test data signals D2_1 to D2_8 outputted from the second block 100B, and generate seventh and eighth fail detection signals DET_OUT7B and DET_OUT8B. For example, the fourth fail detecting section 44 receives a third test data signal D1_3 and a seventh test data signal D1_7 among the plurality of first test data signals D1_1 to D1_8. Also, the fourth fail detecting section 44 receives a third test data signal D2_3 and a seventh test data signal D2_7 among the plurality of second test data signals D2_1 to D2_8.

The fourth fail detecting section 44 includes seventh and eighth exclusive NOR gates XNOR7 and XNOR8, tenth to twelfth AND gates AND10, AND11 and AND12, seventh and eighth NOR gates NOR7 and NOR8, and a fourth NAND gate NAND4. The seventh exclusive NOR gate XNOR7 receives the third and seventh test data signals D1_3 and D1_7 among the plurality of first test data signals D1_1 to D1_8. The eighth exclusive NOR gate XNOR8 receives the third and seventh test data signals D2_3 and D2_7 among the plurality of second test data signals D2_1 to D2_8. The tenth AND gate AND10 receives the third and seventh test data signals D1_3 and D1_7 among the plurality of first test data signals D1_1 to D1_8 and the third and seventh test data signals D2_3 and D2_7 among the plurality of second test data signals D2_1 to D2_8. The seventh NOR gate NOR7 receives the third and seventh test data signals D1_3 and D1_7 among the plurality of first test data signals D1_1 to D1_8 and the third and seventh test data signals D2_3 and D2_7 among the plurality of second test data signals D2_1 to D2_8. The eighth NOR gate NOR8 receives the output signals of the tenth AND gate AND10 and the seventh NOR gate NOR7. The fourth NAND gate NAND4 receives the output signals of the seventh and eighth exclusive NOR gates XNOR7 and XNOR8 and the output signal of the eighth NOR gate NOR8. The eleventh AND gate AND11 receives the output signals of the seventh exclusive NOR gate XNOR7 and the fourth NAND gate NAND4 and outputs the seventh fail detection signal DET_OUT7B. The twelfth AND gate AND12 receives the output signals of the eighth exclusive NOR gate XNOR8 and the fourth NAND gate NAND4 and outputs the eighth fail detection signal DET_OUT8B.

The fourth fail detecting section 44 is configured in the same way as the first fail detecting section 41, except the signals inputted thereto and the signals outputted therefrom.

If the levels of the first test data signals D1_3 and D1_7 among the first and second test data signals D1_3, D1_7, D2_3 and D2_7 of the first and second blocks 100A and 100B, which are inputted to the fourth fail detecting section 44, are different from each other, that is, if a 1-bit fail occurs in the first block 100A, the fourth fail detecting section 44 disables the seventh fail detection signal DET_OUT7B of the seventh and eighth fail detection signals DET_OUT7B and DET_OUT8B, to a low level. Meanwhile, if the levels of the second test data signals D2_3 and D2_7 among the first and second test data signals D1_3, D1_7, D2_3 and D2_7 of the first and second blocks 100A and 100B, which are inputted to the fourth fail detecting section 44, are different from each other, that is, if a 1-bit fail occurs in the second block 100B, the fourth fail detecting section 44 disables the eighth fail detection signal DET_OUT8B of the seventh and sixth fail detection signals DET_OUT7B and DET_OUT8B, to a low level.

Moreover, if all of the levels of the first and second test data signals D1_3, D1_7, D2_3 and D2_7 of the first and second blocks 100A and 100B, which are inputted to the fourth fail detecting section 44, are the same with one another, that is, if both the first and second blocks 100A and 100B are normal, the fourth fail detecting section 44 enables both the seventh and eighth fail detection signals DET_OUT7B and DET_OUT8B to high levels.

Furthermore, in the case where, among the first and second test data signals D1_3, D1_7, D2_3 and D2_7 of the first and second blocks 100A and 100B which are inputted to the fourth fail detecting section 44, the first test data signals D1_3 and D1_7 have the same level, the second test data signals D2_3 and D2_7 have the same level and the first test data signals D1_3 and D1_7 and the second test data signals D2_3 and D2_7 have different levels, that is, in the case where one block of the first and second blocks 100A and 100B fails by 2 bits, the fourth fail detecting section 44 disables both the seventh and eighth fail detection signals DET_OUT7B and DET_OUT8B to low levels.

The fail determining section 45 is configured to disable a first final fail detection signal DET_COMP1B to a low level when even any one signal of the first, third, fifth and seventh fail detection signals DET_OUT1B, DET_OUT3B, DET_OUT5B and DET_OUT7B is disabled to a low level. The fail determining section 45 is configured to disable a second final fail detection signal DET_COMP2B to a low level when even any one signal of the second, fourth, sixth and eighth fail detection signals DET_OUT2B, DET_OUT4B, DET_OUT6B and DET_OUT8B is disabled to a low level. Also, the fail determining section 45 is configured to enable both the first and second final fail detection signals DET_COMP1B and DET_COMP2B to high levels when all the first to eighth fail detection signals DET_OUT1B to DET_OUT8B are enabled to high levels.

The fail determining section 45 includes thirteenth and fourteenth AND gates AND13 and AND14. The thirteenth AND gate AND13 receives the first, third, fifth and seventh fail detection signals DET_OUT1B, DET_OUT3B, DET_OUT5B and DET_OUT7B and outputs the first final fail detection signal DET_COMP1B. The fourteenth AND gate AND14 receives the second, fourth, sixth and eighth fail detection signals DET_OUT2B, DET_OUT4B, DET_OUT6B and DET_OUT8B and outputs the second final fail detection signal DET_COMP2B.

The error detecting unit 200 in accordance with the fifth embodiment of the present invention, configured as mentioned above, operates as follows.

The first fail detecting section 41 disables the first fail detection signal DET_OUT1B to the low level when the levels of the test data signals D1_2 and D1_6 inputted from the first block 100A among the 2-bit test data signals D1_2 and D1_6 inputted from the first block 100A and the 2-bit test data signals D2_2 and D2_6 inputted from the second block 100B are different from each other, that is, when 1 bit of the 2-bit test data signals D1_2 and D1_6 inputted from the first block 100A fails. Further, the first fail detecting section 41 disables the second fail detection signal DET_OUT2B to the low level when the levels of the test data signals D2_2 and D2_6 inputted from the second block 100B among the 2-bit test data signals D1_2 and D1_6 inputted from the first block 100A and the 2-bit test data signals D2_2 and D2_6 inputted from the second block 100B are different from each other, that is, when 1 bit of the 2-bit test data signals D2_2 and D2_6 inputted from the second block 100B fails.

The first fail detecting section 41 enables both the first and second fail detection signals DET_OUT1B and DET_OUT2B to the high levels when all of the 2-bit test data signals D1_2 and D1_6 inputted from the first block 100A and the 2-bit test data signals D2_2 and D2_6 inputted from the second block 100B are the same with each other.

In the case where the 2-bit test data signals D1_2 and D1_6 inputted from the first block 100A have the same level, the 2-bit test data signals D2_2 and D2_6 inputted from the second block 100B have the same level, and the test data signals D1_2 and D1_6 outputted from the first block 100A and the test data signals D2_2 and D2_6 outputted from the second block 100B have different levels, the first fail detecting section 41 determines 2-bit test data signals outputted from one block among the 2-bit test data signals D1_2, D1_6, D2_2 and D2_6 outputted from the first and second respective blocks 100A and 100B, as a 2-bit fail, and disables both the first and second fail detection signals DET_OUT1B and DET_OUT2B to the low levels.

The second to fourth fail detecting sections 42 to 44 perform the same operations as the first fail detecting section 41.

That is to say, the second fail detecting section 42 disables the third fail detection signal DET_OUT3B to the low level when 1 bit of the test data signals D1_4 and D1_8 inputted from the first block 100A fails. The second fail detecting section 42 disables the fourth fail detection signal DET_OUT4B to the low level when 1 bit of the test data signals D2_4 and D2_8 inputted from the second block 100B fails. The second fail detecting section 42 disables both the third and fourth fail detection signals DET_OUT3B and DET_OUT4B to the low levels when 2 bits of the test data signals outputted from one block of the first and second blocks 100A and 100B fail. The second fail detecting section 42 enables both the third and fourth fail detection signals DET_OUT3B and DET_OUT4B to the high levels when the test data signals D1_4, D1_8, D2_4 and D2_8 inputted from the first and second blocks 100A and 100B have the same level, that is, are normal.

The third fail detecting section 43 disables the fifth fail detection signal DET_OUT5B to the low level when 1 bit of the test data signals D1_1 and D1_5 inputted from the first block 100A fails. The third fail detecting section 43 disables the sixth fail detection signal DET_OUT6B to the low level when 1 bit of the test data signals D2_1 and D2_5 inputted from the second block 100B fails. The third fail detecting section 43 disables both the fifth and sixth fail detection signals DET_OUT5B and DET_OUT6B to the low levels when 2 bits of the test data signals outputted from one block of the first and second blocks 100A and 100B fail. The third fail detecting section 43 enables both the fifth and sixth fail detection signals DET_OUT5B and DET_OUT6B to the high levels when the test data signals D1_1, D1_5, D2_1 and D2_5 inputted from the first and second blocks 100A and 100B have the same level, that is, are normal.

The fourth fail detecting section 44 disables the seventh fail detection signal DET_OUT7B to the low level when 1 bit of the test data signals D1_3 and D1_7 inputted from the first block 100A fails. The fourth fail detecting section 44 disables the eighth fail detection signal DET_OUT8B to the low level when 1 bit of the test data signals D2_3 and D2_7 inputted from the second block 100B fails. The fourth fail detecting section 44 disables both the seventh and eighth fail detection signals DET_OUT7B and DET_OUT8B to the low levels when 2 bits of the test data signals outputted from one block of the first and second blocks 100A and 100B fail. The fourth fail detecting section 44 enables both the seventh and eighth fail detection signals DET_OUT7B and DET_OUT8B to the high levels when the test data signals D1_3, D1_7, D2_3 and D2_7 inputted from the first and second blocks 100A and 100B have the same level, that is, are normal.

The fail determining section 45 disables the first final fail detection signal DET_COMP1B to the low level when even one signal of the first, third, fifth and seventh fail detection signals DET_OUT1B, DET_OUT3B, DET_OUT5B and DET_OUT7B is disabled to the low level. The fail determining section 45 disables the second final fail detection signal DET_COMP2B to the low level when even one signal of the second, fourth, sixth and eighth fail detection signals DET_OUT2B, DET_OUT4B, DET_OUT6B and DET_OUT8B is disabled to the low level. Also, the fail determining section 45 enables both the first and second final fail detection signals DET_COMP1B and DET_COMP2B to the high levels when all of the first to eighth fail detection signals DET_OUT1B to DET_OUT8B are enabled to the high levels.

As a result, the error detecting unit 200 in accordance with the fifth embodiment of the present invention disables the first final fail detection signal DET_COMP1B of the first and second final fail detection signals DET_COMP1B and DET_COMP2B to the low level when a 1-bit fail occurs in the plurality of first test data signals D1_1 to D1_8 outputted from the first block 100A among the plurality of first test data signals D1_1 to D1_8 outputted from the first block 100A and the plurality of second test data signals D2_1 to D2_8 outputted from the second block 100B. The error detecting unit 200 disables the second final fail detection signal DET_COMP2B of the first and second final fail detection signals DET_COMP1B and DET_COMP2B to the low level when a 1-bit fail occurs in the plurality of second test data signals D2_1 to D2_8 outputted from the second block 100B among the plurality of first test data signals D1_1 to D1_8 outputted from the first block 100A and the plurality of second test data signals D2_1 to D2_8 outputted from the second block 100B. The error detecting unit 200 enables both the first and second final fail detection signals DET_COMP1B and DET_COMP2B to the high levels when all of the plurality of first test data signals D1_1 to D1_8 outputted from the first block 100A and the plurality of second test data signals D2_1 to D2_8 outputted from the second block 100B have the same level, that is, are normal. The error detecting unit 200 disables both the first and second final fail detection signals DET_COMP1B and DET_COMP2B to the low levels when a 2-bit fail occurs among the plurality of test data signals outputted from any one block of the first and second blocks 100A and 100B among the plurality of first test data signals D1_1 to D1_8 outputted from the first block 100A and the plurality of second test data signals D2_1 to D2_8 outputted from the second block 100B.

The error detecting unit in accordance with the fifth embodiment of the present invention disables one final fail detection signal of the two final fail detection signals to the low level when a 1-bit fail occurs in the test data signals outputted from one block of the two blocks. Further, the error detecting unit disables both the two final fail detection signals when a 2-bit fail occurs in the test data signals outputted from one block of the two blocks. Moreover, the error detecting unit enables both the two final fail detection signals when all the test data signals outputted from the two blocks are normal.

As can be readily seen from the above descriptions, in the present invention, it is possible to sort out a block in which a 1-bit fail occurs, among a plurality of blocks, and it is also possible to detect a 2-bit fail.

For reference, embodiments including additional component elements may be exemplified in order to describe the present invention in further detail. Moreover, an active high configuration or an active low configuration for indicating the activated states of signals and circuits may vary depending upon an embodiment. It is to be understood that the configurations of transistors and logic gates may be changed in order to realize the same function as the occasion demands. That is to say, NANDing elements, NORing elements, etc. can be configured by various combinations of NAND gates, NOR gates, inverters, and so forth. Since these circuit changes have a large number of cases and can be easily inferred by those skilled in the art, the enumeration thereof will be omitted herein.

While certain embodiments have been described above with reference to illustrative examples for particular applications, it will be understood to those skilled in the art that the embodiments described are by way of example only. Those skilled in the art with access to the teachings provided in this disclosure will recognize additional modifications, applications, and/or embodiments and additional fields in which the present disclosure would be of significant utility. Accordingly, the test circuit and the semiconductor memory apparatus described herein should not be limited based on the described embodiments. Rather, the test circuit and the semiconductor memory apparatus described herein should only be limited in light of the claims that follow when taken in conjunction with the above description and accompanying drawings.

What is claimed is:

1. An error detecting circuit of a semiconductor apparatus, comprising:
a fail detecting section configured to receive 2-bit first test data signals outputted from a first block and 2-bit second test data signals outputted from a second block, disable a first fail detection signal when the 2-bit first test data signals have different levels, disable a second fail detection signal when the 2-bit second test data signals have different levels, and disable both the first and second fail detection signals when the 2-bit first test data signals have the same level, the 2-bit second test data signals have the same level, but levels of the 2-bit first test data signals are different from levels of the 2-bit second test data signals.

2. The error detecting circuit according to claim 1, wherein the fail detecting section enables both the first and second fail detection signals in the case where the 2-bit first test data signals have the same level, the 2-bit second test data signals have the same level, and levels of the 2-bit first test data signals are same with levels of the 2-bit second test data signals.

3. The error detecting circuit according to claim 2, wherein the fail detecting section comprises:
a first exclusive NOR gate configured to receive the 2-bit first test data signals;
a second exclusive NOR gate configured to receive the 2-bit second test data signals;
a first AND gate configured to receive the 2-bit first and second test data signals;
a first NOR gate configured to receive the 2-bit first and second test data signals;
a second NOR gate configured to receive respective output signals of the first AND gate and the first NOR gate;
a NAND gate configured to receive respective output signals of the first and second exclusive NOR gates and an output signal of the second NOR gate;
a second AND gate configured to receive the output signal of the first exclusive NOR gate and an output signal of the NAND gate and output the first fail detection signal; and
a third AND gate configured to receive the output signal of the second exclusive NOR gate and the output signal of the NAND gate and output the second fail detection signal.

4. An error detecting circuit of a semiconductor apparatus, comprising:
a first fail detecting section configured to receive a part of test data signals among a plurality of first test data signals outputted from a first block, receive a part of test data signals among a plurality of second test data signals outputted from a second block, and generate a first fail detection signal and a second fail detection signal;
a second fail detecting section configured to receive the other part of test data signals among the plurality of first test data signals, receive the other part of test data signals among the plurality of second test data signals, and generate a third fail detection signal and a fourth fail detection signal; and
a fail determining section configured to enable a first final fail detection signal when both the first and third fail detection signals are enabled, and enable a second final fail detection signal when both the second and fourth fail detection signals are enabled.

5. The error detecting circuit according to claim 4, wherein the first fail detecting section disables the first fail detection signal of the first and second fail detection signals when a 1-bit fail occurs in the part of test data signals among the plurality of first test data signals, disables the second fail detection signal of the first and second fail detection signals when a 1-bit fail occurs in the part of test data signals among the plurality of second test data signals, disables both the first and second fail detection signals when a 2-bit fail occurs in any one test signal among the part of test data signals of the plurality of first test data signals and the part of test data signals of the plurality of second test data signals, and enables both the first and second fail detection signals when both the part of test data signals of the plurality of first test data signals and the part of test data signals of the plurality of second test data signals are normal.

6. The error detecting circuit according to claim 5,
wherein the part of test data signals among the plurality of first test data signals are 2-bit test data signals,
wherein the part of test data signals among the plurality of second test data signals are 2-bit test data signals, and
wherein the first fail detecting section determines occurrence of a 1-bit fail when levels of the 2-bit test data signals among the plurality of first test data signals are different from each other, determines occurrence of a 1-bit fail when levels of the 2-bit test data signals among the plurality of second test data signals are different from each other, and determines occurrence of a 2-bit fail in the case where levels of the 2-bit test data signals among the plurality of first test data signals are the same with each other, levels of the 2-bit test data signals among the plurality of second test data signals are the same with each other, and the levels of the 2-bit test data signals among the plurality of first test data signals and the levels of the 2-bit test data signals among the plurality of second test data signals are different from each other.

7. The error detecting circuit according to claim 4, wherein the second fail detecting section disables the third fail detection signal of the third and fourth fail detection signals when a 1-bit fail occurs in the other part of test data signals among the plurality of first test data signals, disables the fourth fail detection signal of the third and fourth fail detection signals when a 1-bit fail occurs in the other part of test data signals among the plurality of second test data signals, disables both the third and fourth fail detection signals when a 2-bit fail occurs in any one test signal among the other part of test data signals of the plurality of first test data signals and the other part of test data signals of the plurality of second test data signals, and enables both the third and fourth fail detection signals when both the other part of test data signals of the plurality of first test data signals and the other part of test data signals of the plurality of second test data signals are normal.

8. The error detecting circuit according to claim 7,
wherein the other part of test data signals among the plurality of first test data signals are 2-bit test data signals,
wherein the other part of test data signals among the plurality of second test data signals are 2-bit test data signals, and
wherein the second fail detecting section determines occurrence of a 1-bit fail when levels of the 2-bit test data signals among the plurality of first test data signals are different from each other, determines occurrence of a 1-bit fail when levels of the 2-bit test data signals among the plurality of second test data signals are different from each other, and determines occurrence of a 2-bit fail in the case where levels of the 2-bit test data signals among the plurality of first test data signals are the same with each other, levels of the 2-bit test data signals among the plurality of second test data signals are the same with each other, and the levels of the 2-bit test data signals among the plurality of first test data signals and the levels of the 2-bit test data signals among the plurality of second test data signals are different from each other.

* * * * *